(12) United States Patent
Araragi

(10) Patent No.: US 10,715,129 B2
(45) Date of Patent: Jul. 14, 2020

(54) SWITCHING ELEMENT DRIVING DEVICE

(71) Applicant: DENSO CORPORATION, Kariya, Aichi-pref. (JP)

(72) Inventor: Akifumi Araragi, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 16/450,489

(22) Filed: Jun. 24, 2019

(65) Prior Publication Data

US 2020/0007118 A1    Jan. 2, 2020

(30) Foreign Application Priority Data

Jun. 27, 2018   (JP) ................. 2018-122250

(51) Int. Cl.
*H03K 17/687* (2006.01)
*H03K 17/0412* (2006.01)

(52) U.S. Cl.
CPC ............... *H03K 17/0412* (2013.01)

(58) Field of Classification Search
CPC .. H03K 17/63; H03K 17/567; H03K 17/0412; H03K 16/04123; H03K 17/04126; H03K 17/6872; H03K 17/6877; H03K 17/693; H03K 17/162; H03K 17/168; H03K 19/00361; H03K 19/09448; H03K 2217/0036; H04L 25/0272; G11C 7/12
See application file for complete search history.

(56) References Cited

U.S. PATENT DOCUMENTS

| | | | |
|---|---|---|---|
| 8,723,562 B2* | 5/2014 | Suzuki | H03K 17/165 327/108 |
| 2016/0233858 A1 | 8/2016 | Wasekura et al. | |
| 2017/0033790 A1* | 2/2017 | Osanai | H03K 17/567 |

FOREIGN PATENT DOCUMENTS

JP       2013-017092 A      1/2013

* cited by examiner

*Primary Examiner* — Long Nguyen
(74) *Attorney, Agent, or Firm* — Oliff PLC

(57) ABSTRACT

A switching element driving device includes a main on switch that is connected to gates of a first and second IGBTs and that, when brought into a conductive state, turns on the first and second IGBTs, diodes each disposed between the main on switch and one of the gates of the first and second IGBTs, the diodes having a forward direction from the main on switch to the gates of the first and second IGBTs, an on sub-switch that is connected to the gate of the second IGBT and that, when brought into the conductive state, turns on the second IGBT, and a control circuit that controls the conductive state and a non-conductive state of the main on switch and the on sub-switch.

15 Claims, 10 Drawing Sheets

SWITCHING ELEMENT DRIVING DEVICE

CROSS-REFERENCE TO RELATED APPLICATION

This application is based on and claims the benefit of priority from earlier Japanese Patent Application No. 2018-122250 filed Jun. 27, 2018, the description of which is incorporated herein by reference.

BACKGROUND

Technical Field

The present disclosure relates to a switching element driving device for driving a plurality of switching elements connected in parallel.

Description of the Related Art

Conventionally, a drive circuit for a plurality of switching elements have been disclosed. As an example, a drive circuit is separately provided for a first insulated-gate bipolar transistor (IGBT) and a second insulated-gate bipolar transistor which are connected in parallel.

SUMMARY

The present disclosure provides a switching element driving device that can drive different number of switching elements and that can suppress the shift in the timings of actually turning on a plurality of switching elements when simultaneously driving the switching elements, which are connected in parallel.

The technical features described in the claims, other than the features described above, will become apparent from the following description of the embodiments and the accompanying drawings.

DETAILED DESCRIPTION OF THE PREFERRED EMBODIMENTS

The following describes switching element driving devices according to embodiments of the present disclosure with reference to the drawings. In each of the following embodiments, an IGBT (i.e. insulated-gate bipolar transistor) driving device including IGBTs as switching elements to be connected in parallel will be described. However, the switching elements are not limited to IGBTs, and the switching element driving device may be implemented as, for example, a metal oxide semiconductor field-effect transistor (MOSFET) driving device configured to drive MOSFETs connected in parallel.

An IGBT driven by the IGBT driving devices according to the embodiments is used as, for example, a switching element in an inverter circuit for supplying an AC current to a coil of a motor. In addition, an IGBT driven by the IGBT driving devices according to the embodiments may be used as a switching element for driving an inductive load such as a coil or a solenoid by using high voltages, in particular.

First Embodiment

Figure 1:
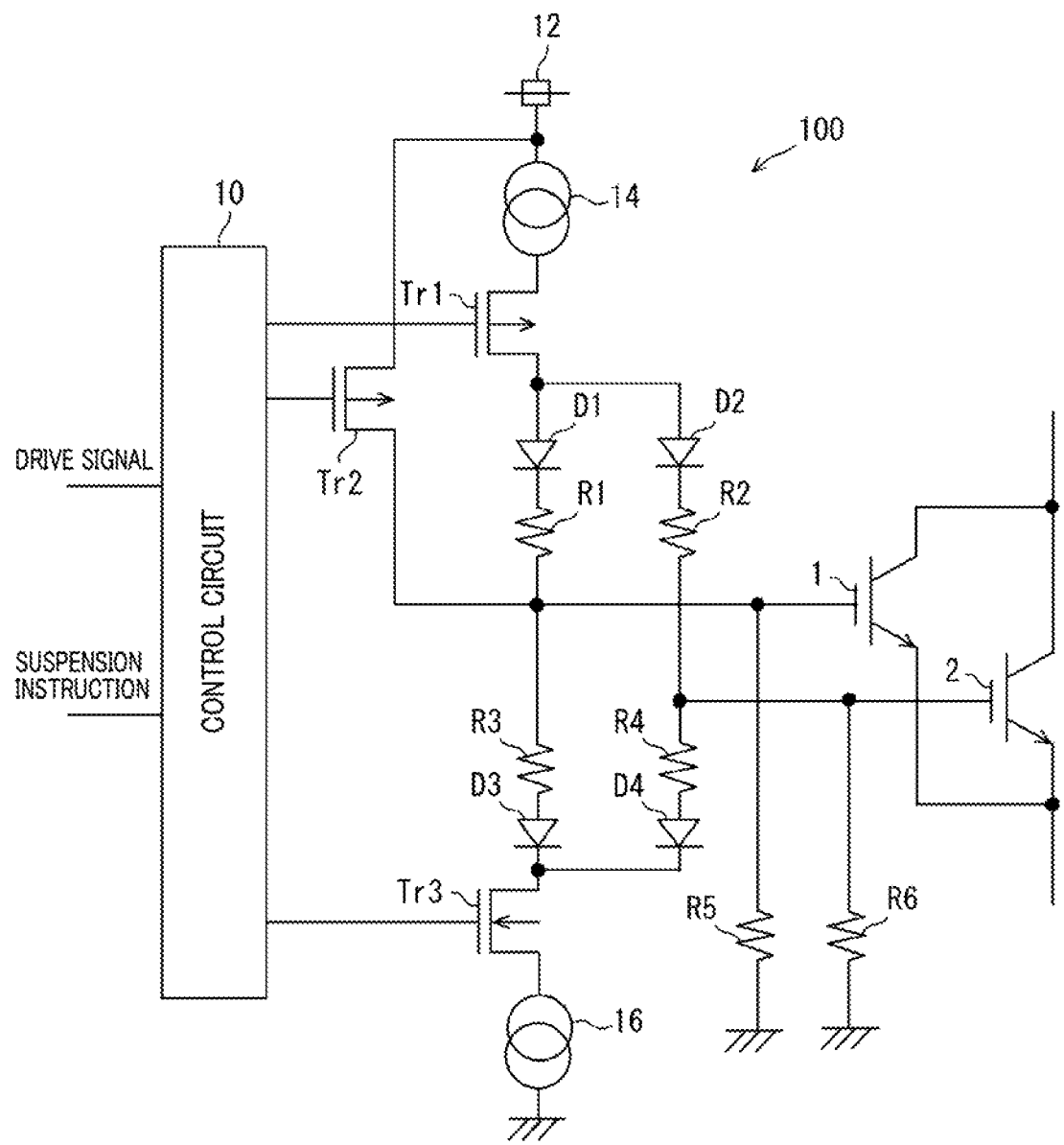
FIG. 1 is a configuration diagram illustrating a circuit configuration of an IGBT driving device according to a first embodiment.

FIG. 1 illustrates a circuit configuration of an IGBT driving device 100 according to a first embodiment. As illustrated in FIG. 1, the IGBT driving device 100 according to the first embodiment drives a first IGBT 1 and a second IGBT 2, which are connected in parallel. The first and second IGBTs 1 and 2 may the same characteristics, such as current-voltage characteristics, or may have different characteristics. In the following description, the first and second IGBTs 1 and 2 have the same characteristics.

The IGBT driving device 100 includes a main on switch Tr1 connected to gates of the first and second IGBTs 1 and 2. The main on switch Tr1 is capable of, when brought into the conductive state, increasing the gate potentials of the first and second IGBTs 1 and 2 to turn on both the first and second IGBTs 1 and 2. As the main on switch Tr1, a p-channel MOSFET may be employed, for example. The p-channel MOSFET serving as the main on switch Tr1 has a source connected to a constant-current circuit 14, and a drain connected to a common line coupled to charge-side branch lines, each connecting to the gate of one of the first and second IGBTs 1 and 2.

The constant-current circuit 14 causes a constant current to flow through the source of the p-channel MOSFET. The constant-current circuit 14 may be disposed in the common line connected to the drain of the p-channel MOSFET.

The charge-side branch lines, each of which connects to the gate of one of the first and second IGBTs 1 and 2, branch from the common line connected to the drain of p-channel MOSFET. The charge-side branch lines are provided with diodes D1 and D2 serving as rectifying elements and balance resistors R1 and R2. The diode D1 and the balance resistor R1 are connected in series, and the diode D2 and the balance resistor R2 are connected in series.

When the main on switch Tr1 is brought into the conductive state, the diodes D1 and D2 allow the constant current from the constant-current circuit 14 to be distributed to the respective charge-side branch lines and to flow to the gates of the first and second IGBTs 1 and 2, respectively. In contrast, when an on sub-switch Tr2 described below is brought into the conductive state while the main on switch Tr1 is in the non-conductive state, the diodes D1 and D2 prevent the current from flowing around from the charge-side branch line coupled to the gate of the first IGBT 1 to the charge-side branch line coupled to the gate of the second IGBT 2. Accordingly, when the on sub-switch Tr2 is in the conductive state, only the first IGBT 1 whose gate is connected to the on sub-switch Tr2 can be driven appropriately.

The prevention of the current from flowing around may be achieved only by the diode D1 disposed in the charge-side branch line for the first IGBT 1. However, if only the charge-side branch line for the first IGBT 1 is provided with the diode D1, a voltage drop would occur across the diode D1 when the main on switch Tr1 is brought into the conductive state, which may cause a difference between the voltages applied to the gates of the first IGBT 1 and the second IGBT 2. In this case, the timings of turning on the first IGBT 1 and the second IGBT 2 can shift. In this embodiment, accordingly, the charge-side branch line for the first IGBT 1 and the charge-side branch line for the second IGBT 2 are provided with the diodes D1 and D2, respectively. The diodes D1 and D2 have the same characteristics such as drop voltage.

The balance resistors R1 and R2 have an effect of promoting reduction of any difference between the gate potentials of the first IGBT 1 and the second IGBT 2 when the main on switch Tr1 is in the conductive state. This effect will be described in detail with reference to FIGS. 2 and 3.

Figure 2:
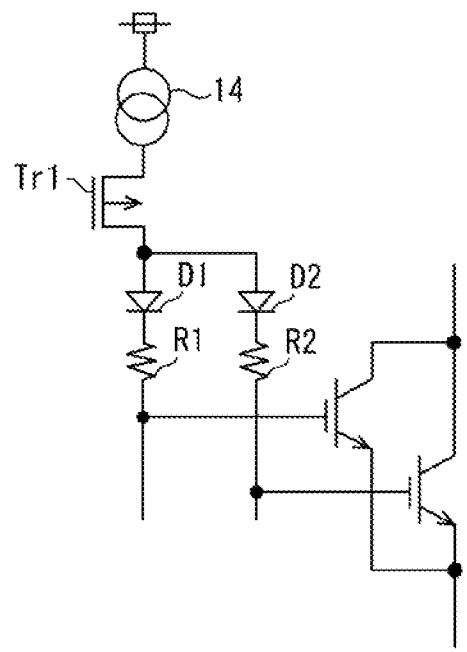
FIG. 2 is a diagram illustrating a gate charge circuit of the IGBT driving device according to the first embodiment.
Figure 3:
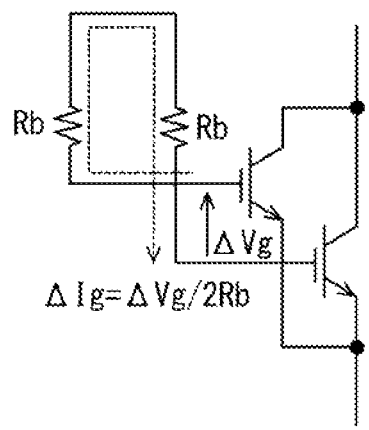
FIG. 3 is a diagram illustrating an alternating current (AC) equivalent circuit of the gate charge circuit illustrated in FIG. 2.

A gate charge circuit including the main on switch Tr1, which is illustrated in FIG. 2, may be replaced with an AC equivalent circuit illustrated in FIG. 3. That is, when the main on switch Tr1 is brought into the conductive state and current flows from the constant-current circuit 14 to the gates of the first and second IGBTs 1 and 2, the ideal impedance of the constant-current circuit 14 is infinite and thus the constant-current circuit 14 can be assumed to act as an open circuit in the AC equivalent circuit. The diodes D1 and D2 can also be assumed to act as short circuits on the basis of the premise that the AC impedances of both the diodes D1 and D2 are very low. Accordingly, the AC equivalent circuit illustrated in FIG. 3 is obtained. As illustrated in FIG. 3, the balance resistors R1 and R2 have the same resistance value Rb.

As illustrated in FIG. 3, if a potential difference of ΔVg occurs between the gates of the first and second IGBTs 1 and 2 during the charging of the gates of the first and second IGBTs 1 and 2, the current ΔIg, given by equation (1) below, flows from the gate on the high-potential side to the gate on the low-potential side since a closed circuit is formed between the gates such that the gates are connected via the balance resistors R1 and R2.

$$\Delta Ig = \Delta Vg/2Rb \qquad (1)$$

As described above, even if a potential difference occurs between the gates of the first and second IGBTs 1 and 2 during the charging of the gates of the first and second IGBTs 1 and 2, the flow of current through each of the gates is automatically adjusted (self-adjusted) so as to reduce the potential difference.

In other words, in this embodiment, the first and second IGBTs 1 and 2 are implemented as elements having the same characteristics, the diodes D1 and D2 are implemented as elements having the same characteristics, and the balance resistors R1 and R2 are implemented as elements having the same characteristics. Accordingly, when the main on switch Tr1 is brought into the conductive state and current is caused to pass from the constant-current circuit 14 to the gates of the first IGBT 1 and the second IGBT 2, the constant current generated by the constant-current circuit 14 is evenly distributed so that the same current can flow through the gates of the first and second IGBTs 1 and 2 if no potential difference occurs between the gates of the first and second IGBTs 1 and 2. If a potential difference occurs between the gates of the first and second IGBTs 1 and 2 during the charging of the gates of the first and second IGBTs 1 and 2, the flow of current is automatically adjusted such that the amount of current flowing through the gate having a relatively low potential is larger than the amount of current flowing through the gate having a relatively high potential. This enables alignment of the timings of turning on the first and second IGBTs 1 and 2.

In an actual circuit, the lines, the diodes D1 and D2, the gates of the first and second IGBTs 1 and 2, and so on have impedance components. The automatic current adjustment function described above may thus be exerted even if the balance resistors R1 and R2 are not provided.

The description continues referring back to FIG. 1. As illustrated in FIG. 1, the IGBT driving device 100 further includes, in addition to the main on switch Tr1, the on sub-switch Tr2 in parallel with the main on switch Tr1. The on sub-switch Tr2 is connected to the gate of the first IGBT 1. The on sub-switch Tr2 is capable of, when brought into the conductive state, increasing the gate potential of the first IGBT 1 to turn on the first IGBT 1. That is, the number of IGBTs whose gates are connected to the on sub-switch Tr2 is smaller than the number of IGBTs whose gates are connected to the main on switch Tr1, and the on sub-switch Tr2 is capable of turning on only the IGBTs whose gates are connected to the on sub-switch Tr2. Switching between the use of the main on switch Tr1 and the on sub-switch Tr2 as appropriate can change the number of IGBTs to be driven.

The on sub-switch Tr2 is also constituted by a p-channel MOSFET, similarly to, for example, the main on switch Tr1. When the on sub-switch Tr2 is in the conductive state, a high potential is applied from a power supply potential 12 to the gate of the first IGBT 1.

The IGBT driving device 100 further includes an off main switch Tr3. The off main switch Tr3 is connected to the gates of the first and second IGBTs 1 and 2 on the downstream side of the diodes D1 and D2. The off main switch Tr3 is brought into the conductive state when the first and second IGBTs 1 and 2 are switched from on to off, and discharges the electric charge in the gates of the turned-on IGBTs to increase the speed of turning off the turned-on IGBTs. The off main switch Tr3 is constituted by, for example, an n-channel MOSFET. The n-channel MOSFET serving as the off main switch Tr3 has a source connected to a constant-current circuit 16, and a drain connected to a common line coupled to discharge-side branch lines, each connecting to the gate of one of the first and second IGBTs 1 and 2.

The constant-current circuit 16 causes a constant current to flow through the source of the n-channel MOSFET. The constant-current circuit 16 may be disposed in the common line connected to the drain of the n-channel MOSFET.

The discharge-side branch lines, each of which connects to the gate of one of the first and second IGBTs 1 and 2, branch from the common line connected to the drain of the n-channel MOSFET. The discharge-side branch lines are provided with diodes D3 and D4 serving as rectifying elements and balance resistors R3 and R4. The diode D3 and the balance resistor R3 are connected in series, and the diode D4 and the balance resistor R4 are connected in series.

When the off main switch Tr3 is brought into the conductive state while the first and second IGBTs 1 and 2 remain on, the diodes D3 and D4 allow current to flow from the gates of the first and second IGBTs 1 and 2 to the constant-current circuit 16. In this case, the total value of the currents flowing from the gates of the first and second IGBTs 1 and 2 to the constant-current circuit 16 is equal to the constant current defined by the constant-current circuit 16. In contrast, when only the first IGBT 1 is turned on by the on sub-switch Tr2, the diodes D3 and D4 prevent the current from flowing around from the discharge-side branch line coupled to the gate of the first IGBT 1 to the discharge-side branch line coupled to the gate of the second IGBT 2.

The prevention of the current from flowing around may be achieved only by the diode D4 disposed in the discharge-side branch line for the second IGBT 2. However, if only the discharge-side branch line for the second IGBT 2 is provided with the diode D4, a voltage drop would occur across the diode D4 when the off main switch Tr3 is brought into the conductive state, which may cause a difference between the gate voltages of the first IGBT 1 and the second IGBT 2. In this case, the timings of turning off the first IGBT 1 and the second IGBT 2 can shift. In this embodiment, accordingly, the discharge-side branch line for the first IGBT 1 and the discharge-side branch line for the second IGBT 2 are provided with the diodes D3 and D4, respectively. The diodes D3 and D4 have the same characteristics such as drop voltage.

Similarly to the balance resistors R1 and R2, the balance resistors R3 and R4 have an effect of promoting reduction of any difference between the gate potentials of the first IGBT 1 and the second IGBT 2 when the off main switch Tr3 is in the conductive state. This enables alignment of the timings of turning off the first and second IGBTs 1 and 2.

In the IGBT driving device 100 according to this embodiment, furthermore, the gate of the first IGBT 1 is grounded via a resistor R5. Likewise, the gate of the second IGBT 2 is grounded via a resistor R6. The resistor R5 and the resistor R6 have the same resistance value. When the main on switch Tr1 and the on sub-switch Tr2 are switched from the conductive state to the non-conductive state, at least part of the electric charge stored in the gates of the IGBTs 1 and 2 is discharged via the resistor R5 and the resistor R6. In particular, as described below, when the state in which the main on switch Tr1 is in the conductive state is switched to the state in which the on sub-switch Tr2 is brought into the conductive state during the IGBT-on period, the off main switch Tr3 remains in the non-conductive state. Accordingly, all of the electric charge stored in the gate of the second IGBT 2 is discharged via the resistor R6.

The IGBT driving device 100 according to this embodiment further includes a control circuit 10 that controls the conductive state and the non-conductive state of the main on switch Tr1, the on sub-switch Tr2, and the off main switch Tr3 in accordance with a drive signal and a suspension instruction signal input from an external control device. For example, the drive signal is a pulse-width modulation (PWM) signal, and the suspension instruction signal is a binary signal having a high level and a low level. The external control device monitors the magnitude of current flowing through the first and second IGBTs 1 and 2. When the value of the current is greater than or equal to a threshold value, the external control device inputs a low-level suspension instruction signal to the control circuit 10 to provide an instruction to simultaneously drive the first and second IGBTs 1 and 2. When the magnitude of the current flowing through the first and second IGBTs 1 and 2 is less than the threshold value, the external control device inputs a high-level suspension instruction signal to the control circuit 10 to provide an instruction to suspend simultaneous driving of the first and second IGBTs 1 and 2 and to switch to the driving of only the first IGBT 1.

Figure 4:
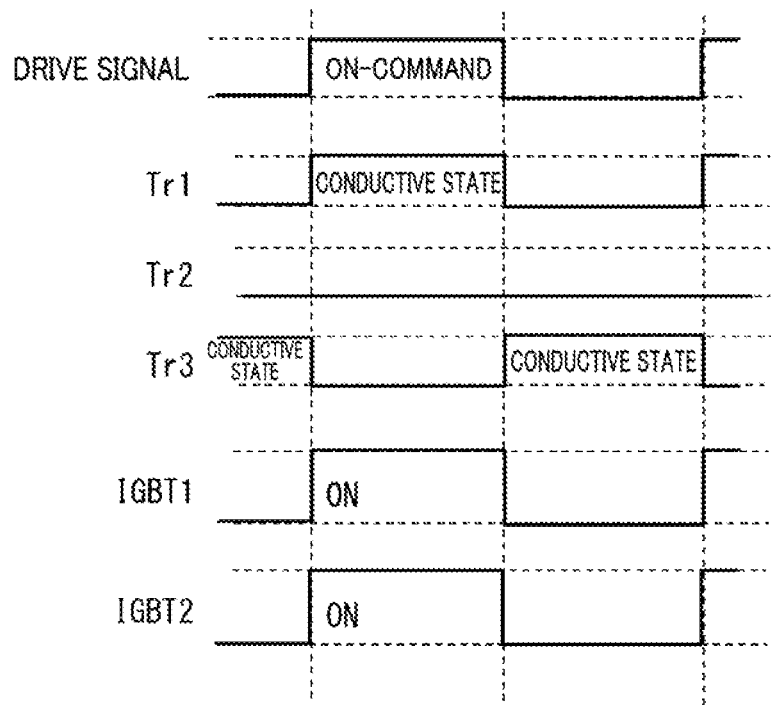
FIG. 4 is a timing chart illustrating signal waveforms of units in the IGBT driving device when the IGBT driving device simultaneously drives a first IGBT and a second IGBT in accordance with a low-level suspension instruction signal.
Figure 5:
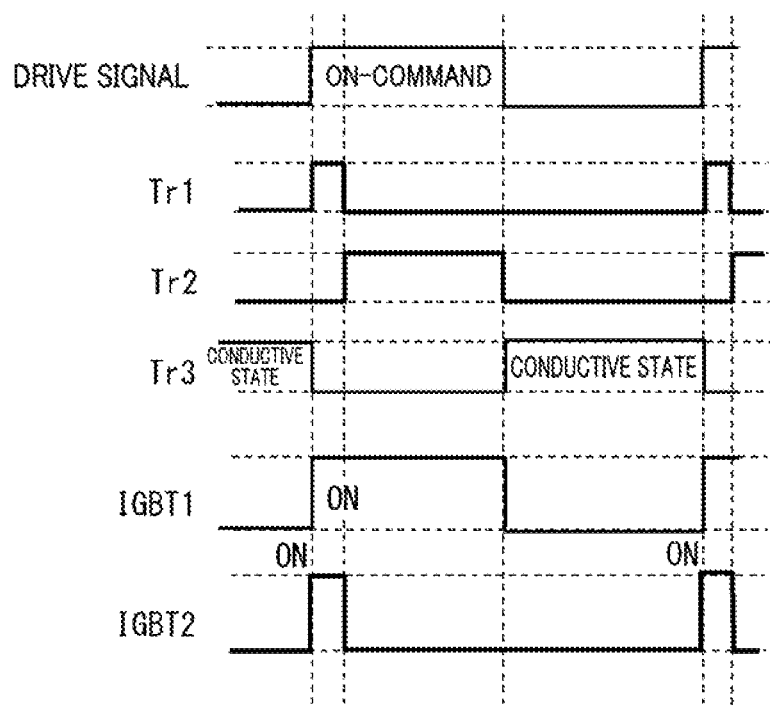
FIG. 5 is a timing chart illustrating signal waveforms of the units in the IGBT driving device when the IGBT driving device switches from the simultaneous driving of the first and second IGBTs to the driving of only the first IGBT during an IGBT-on period in accordance with a high-level suspension instruction signal.

The operation of the IGBT driving device 100 having the configuration described above will be described with reference to timing charts in FIGS. 4 and 5. The timing chart in FIG. 4 illustrates signal waveforms of units in the IGBT driving device 100 when the IGBT driving device 100 simultaneously drives the first and second IGBTs 1 and 2 in accordance with a low-level suspension instruction signal. The timing chart in FIG. 5 illustrates signal waveforms of the units in the IGBT driving device 100 when the IGBT driving device 100 switches from the simultaneous driving of the first and second IGBTs 1 and 2 to the driving of only the first IGBT 1 during the IGBT-on period in accordance with a high-level suspension instruction signal.

When an instruction is given using the suspension instruction signal to simultaneously drive the first and second IGBTs 1 and 2, as illustrated in FIG. 4, the control circuit 10 performs control to keep the main on switch Tr1 in the conductive state over an on-command period during which the drive signal (PWM signal) is in high level, that is, during the IGBT-on period. As a result, the first and second IGBTs 1 and 2 are simultaneously turned on during the on-command period of the drive signal.

After the on-command period of the drive signal is complete, when the drive signal is switched from the high level to the low level, the control circuit 10 switches the main on switch Tr1 from the conductive state to the non-conductive state, and also switches the off main switch Tr3 from the non-conductive state to the conductive state. Accordingly, the electric charge stored in the gates of the first and second IGBTs 1 and 2 is immediately discharged, and the first and second IGBTs 1 and 2 are turned off without delay.

In contrast, when an instruction is given using the suspension instruction signal to suspend simultaneous driving of the first and second IGBTs 1 and 2 and to switch to the driving of only the first IGBT 1, the control circuit 10 performs control to bring the main on switch Tr1 into the conductive state at the beginning of the on-command period of the drive signal to simultaneously turn on the first and second IGBTs 1 and 2. However, at the time when the suspension instruction signal is input, the control circuit 10 performs control to bring the main on switch Tr1 into the non-conductive state and bring the on sub-switch Tr2 into the conductive state. That is, during a period over which both the first and second IGBTs 1 and 2 are on, the external control device determines whether the magnitude of current flowing through the first and second IGBTs 1 and 2 is greater than or equal to a threshold value. When the magnitude of the current is determined to be less than the threshold value, the external control device outputs a suspension instruction signal to the control circuit 10 to provide an instruction to suspend simultaneous driving of the first and second IGBTs 1 and 2 and to switch to the driving of only the first IGBT 1. In accordance with the suspension instruction signal, the control circuit 10 switches the switch to be brought into the conductive state from the main on switch Tr1 to the on sub-switch Tr2.

When the switch to be brought into the conductive state is switched from the main on switch Tr1 to the on sub-switch Tr2, as illustrated in FIG. 5, the first IGBT remains in the on state, whereas the second IGBT 2 is switched from on to off. In this case, as described above, the diode D1 can prevent the current from flowing around from the gate of the first IGBT 1 to the gate of the second IGBT 2, and can turn on only the first IGBT 1. In addition, the electric charge in the gate of the second IGBT 2 is discharged via the resistor R6. This ensures that the second IGBT 2 can be turned off.

As described above, the IGBT driving device 100 according to this embodiment can drive different numbers of IGBTs, and can suppress the shift in the timings of turning on the first and second IGBTs 1 and 2 when simultaneously driving the first and second IGBTs 1 and 2, which are connected in parallel.

Second Embodiment

Figure 6:
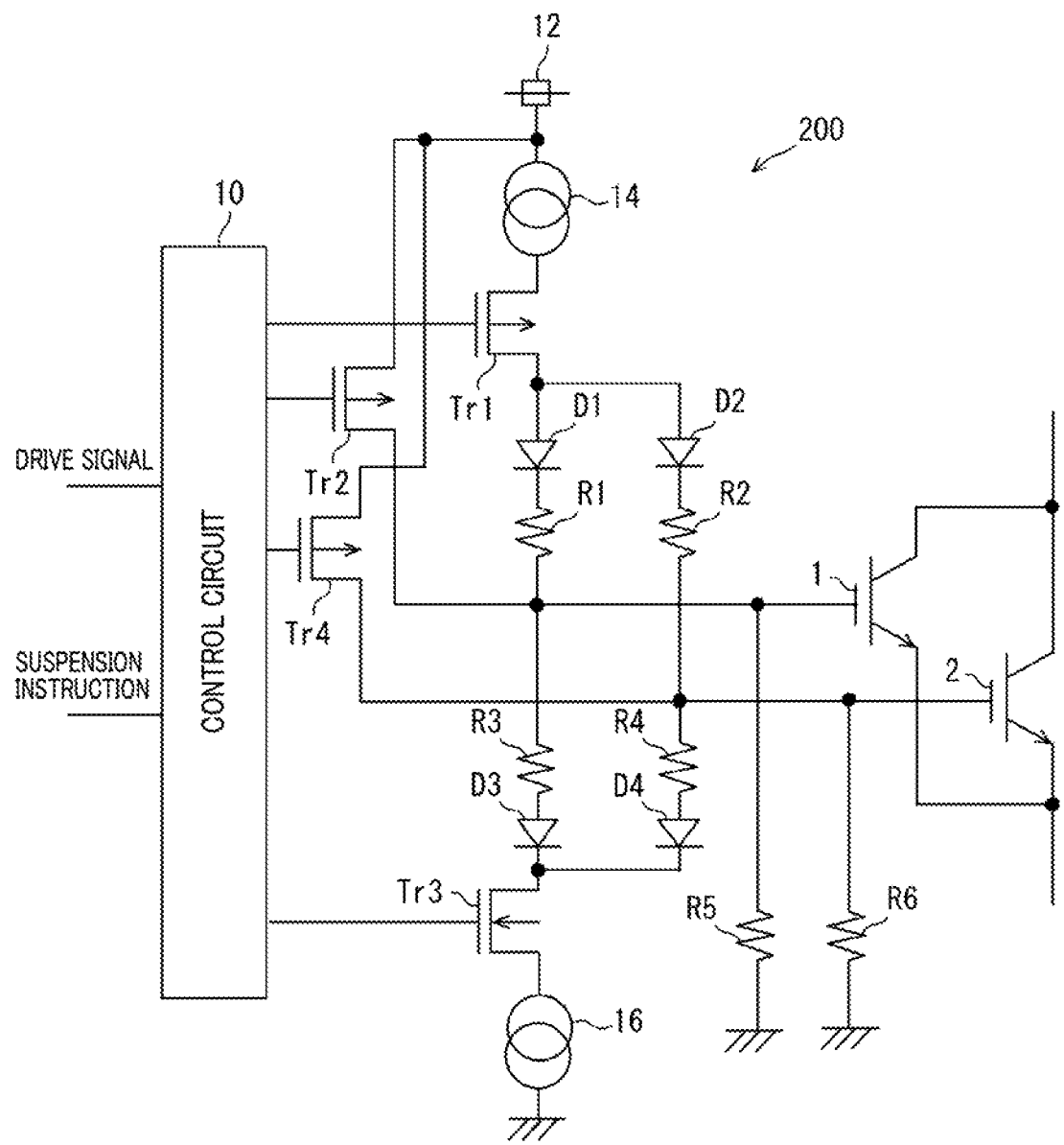
FIG. 6 is a configuration diagram illustrating a circuit configuration of an IGBT driving device according to a second embodiment.
Figure 7:
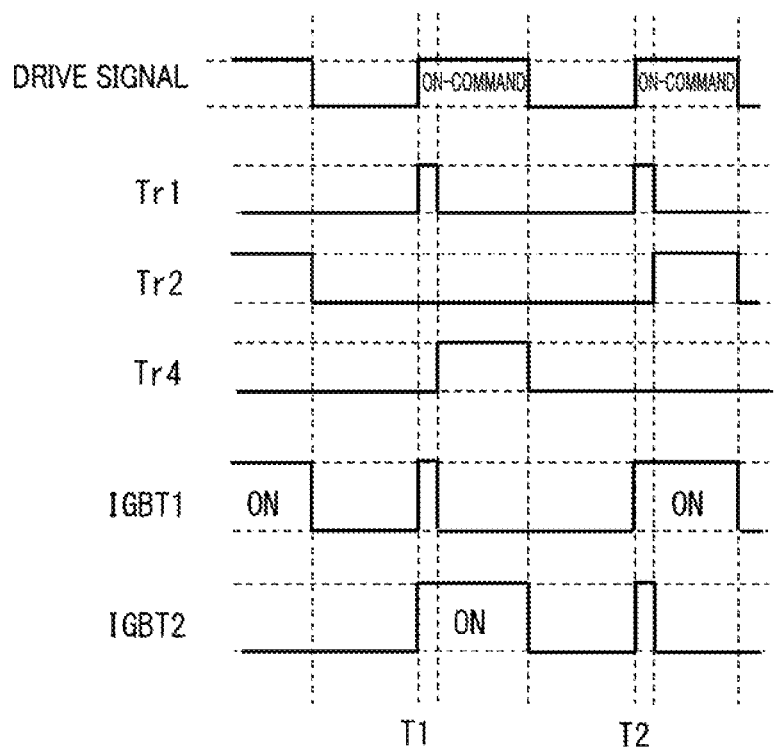
FIG. 7 is a timing chart illustrating the operation of the IGBT driving device according to the second embodiment.

Next, an IGBT driving device 200 according to a second embodiment of the present disclosure will be described with reference to FIGS. 6 and 7.

In the IGBT driving device 100 according to the first embodiment described above, only the on sub-switch Tr2 is provided for the first IGBT 1. In the IGBT driving device 200 according to this embodiment, as illustrated in FIG. 6, the on sub-switch Tr2 is provided for the first IGBT 1, and an on sub-switch Tr4 is provided for the second IGBT 2. That is, the on sub-switches Tr2 and Tr4 are respectively provided for the first and second IGBTs 1 and 2 and are connected to the gates of the IGBTs 1 and 2, respectively, in parallel with the main on switch Tr1. Other configurations of the IGBT driving device 200 according to this embodiment are substantially the same as those of the IGBT driving device 100 according to the first embodiment and will not be described herein.

Next, the operation of the IGBT driving device 200 according to this embodiment will be described. When an instruction is given from the external control device using the suspension instruction signal to simultaneously drive the first and second IGBTs 1 and 2, the on sub-switches Tr2 and Tr4 remain in the non-conductive state. Thus, the IGBT driving device 200 performs operations similar to that of the IGBT driving device 100 according to the first embodiment.

However, when an instruction is given from the external control device using the suspension instruction signal to suspend simultaneous driving of the first and second IGBTs 1 and 2 and to switch to the driving of only either IGBT, the IGBT driving device 200 according to this embodiment performs operation different from that of the IGBT driving device 100 according to the first embodiment. Specifically, as illustrated in a timing chart in FIG. 7, in order to respectively turn on the first and second IGBTs 1 and 2 by using the on sub-switches Tr2 and Tr4 during the on-command period of the drive signal, the control circuit 10 alternately switches between the on sub-switches Tr2 and Tr4 to be brought into the conductive state so that the first IGBT 1 and the second IGBT 2 can be alternately turned on each time an on-command is given. Specifically, as illustrated in FIG. 7, in accordance with an on-command that starts at time T1, the control circuit 10 brings the on sub-switch Tr4 into the conductive state to turn on the second IGBT 2 to separately drive the first and second IGBTs 1 and 2. In accordance with the subsequent on-command that starts at time T4, the control circuit 10 brings the on sub-switch Tr2 into the conductive state to turn on the first IGBT 1.

Driving the first and second IGBTs 1 and 2 in the way described above makes equal the frequency with which the first IGBT 1 is driven and the frequency with which the second IGBT 2 is driven. The frequencies are made equal, thereby dispersing heat generated by the separate driving of the first and second IGBTs 1 and 2 to the two IGBTs 1 and 2.

The method for driving the first and second IGBTs 1 and 2 is not limited to that described above, and any other method may be used to make the frequencies with which the first and second IGBTs 1 and 2 are driven equal to disperse heat generated by the separate driving of the first and second IGBTs 1 and 2 to the first and second IGBTs 1 and 2. For example, the on sub-switches Tr2 and Tr4 to be brought into the conductive state may be alternately switched when an on-command is given the same number of times.

Third Embodiment

Figure 8:
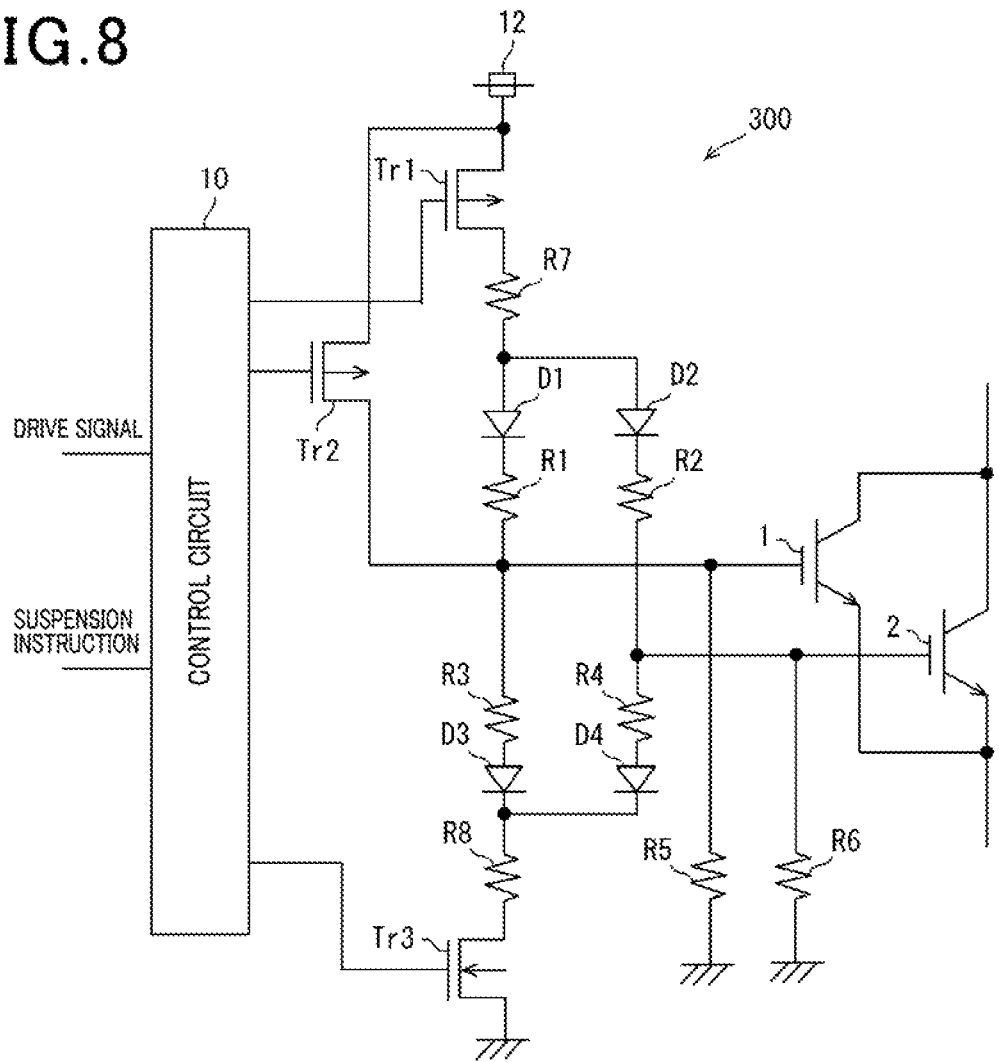
FIG. 8 is a configuration diagram illustrating a circuit configuration of an IGBT driving device according to a third embodiment.

Next, an IGBT driving device 300 according to a third embodiment of the present disclosure will be described with reference to FIGS. 8 to 10.

In the gate charge circuit of the IGBT driving device 100 according to the first embodiment described above, when the main on switch Tr1 is brought into the conductive state, the constant current from the constant-current circuit 14 is distributed to the respective charge-side branch lines coupled to the gates of the IGBTs 1 and 2. In the IGBT driving device 300 according to this embodiment, in contrast, as illustrated in FIG. 8, a common resistor R7 is connected to the common line connected to the drain of the p-channel MOSFET serving as the main on switch Tr1. As a result, a gate charge circuit of the IGBT driving device 300 according to this embodiment applies a constant voltage, which has been dropped across the common resistor R7, to the respective charge-side branch lines coupled to the gates of the IGBTs 1 and 2. That is, the gate charge circuit of the IGBT driving device 300 according to this embodiment drives the gates of the first and second IGBTs 1 and 2 with a constant voltage via the diodes D1 and D2 and the balance resistors R1 and R2.

In addition, a gate discharge circuit of the IGBT driving device 300 according to this embodiment also includes a common resistor R8 disposed in the common line. Accordingly, when the electric charge in the gates of the first and second IGBTs 1 and 2 is discharged, the same voltage is always applied to the respective discharge-side branch lines coupled to the gates of the first and second IGBTs 1 and 2. In other words, the IGBT driving device 300 according to this embodiment drives the first and second IGBTs 1 and 2 with a constant voltage also when the electric charge in the gates is discharged.

The current self-adjustment function for the constant-voltage driving described above will be described using the gate charge circuit as an example with reference to FIGS. 9 and 10.

Figure 9:
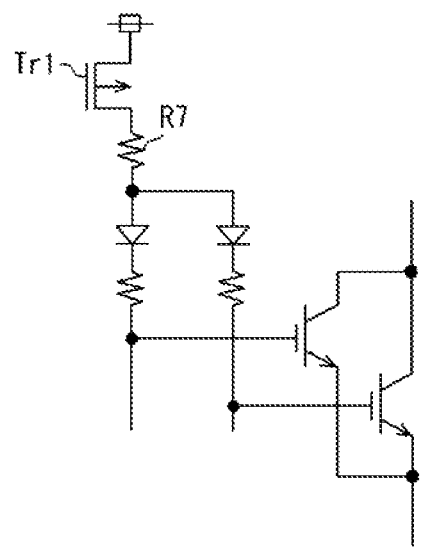
FIG. 9 is a diagram illustrating a gate charge circuit of the IGBT driving device according to the third embodiment.
Figure 10:
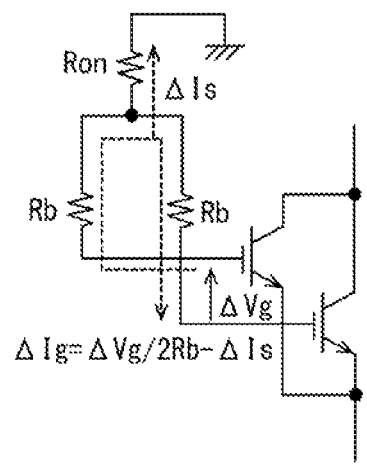
FIG. 10 is a diagram illustrating an AC equivalent circuit of the gate charge circuit illustrated in FIG. 9.

The gate charge circuit illustrated in FIG. 9, including the common resistor R7, may be replaced with an AC equivalent circuit illustrated in FIG. 10. In FIG. 10, if a potential difference of ΔVg occurs between the gates of the first and second IGBTs 1 and 2 during the charging of the gates of the first and second IGBTs 1 and 2, the current ΔIg flows from the gate on the high-potential side to the gate on the low-potential side since the gates of the first and second IGBTs 1 and 2 are connected via the balance resistors R1 and R2.

In the gate charge circuit according to the first embodiment described above, the constant-current circuit 14 can be assumed to act as an open circuit in the AC equivalent circuit. Thus, all the feedback current from one of the gates can be considered to be supplied to the other gate. In the gate charge circuit according to this embodiment, in contrast, as illustrated in FIG. 10, a circuit connecting the gates of the first and second IGBTs 1 and 2 is not a closed circuit, but the common resistor R7 having a resistance value Ron is connected to the circuit. Accordingly, if a potential difference of ΔVg occurs between the gates of the first and second IGBTs 1 and 2, part of the current flowing between the gates of the first and second IGBTs 1 and 2, which is indicated by ΔIs, flows to the outside via the common resistor R7. As a result, the current ΔIg flowing from the gate on the high-potential side to the gate on the low-potential side is given by equation (2) below.

$$\Delta Ig = \Delta Vg / 2Rb - \Delta Is \quad (2)$$

Accordingly, when a potential difference occurs between the gates of the first and second IGBTs 1 and 2, the current adjustment function of the gate charge circuit according to this embodiment is slightly reduced, compared to that of the gate charge circuit according to the first embodiment. On the contrary, the IGBT driving device 300 according to this embodiment has a merit in that the circuit configuration thereof is simpler than that of the IGBT driving device 100 according to the first embodiment.

In the third embodiment described above, both the gate charge circuit and the gate discharge circuit drive the first and second IGBTs 1 and 2 with a constant voltage. Alternatively, only one of the gate charge circuit and the gate discharge circuit may be configured to drive the first and second IGBTs 1 and 2 with a constant voltage, and the other circuit may be configured to drive the first and second IGBTs 1 and 2 with a constant current.

Fourth Embodiment

Figure 11:
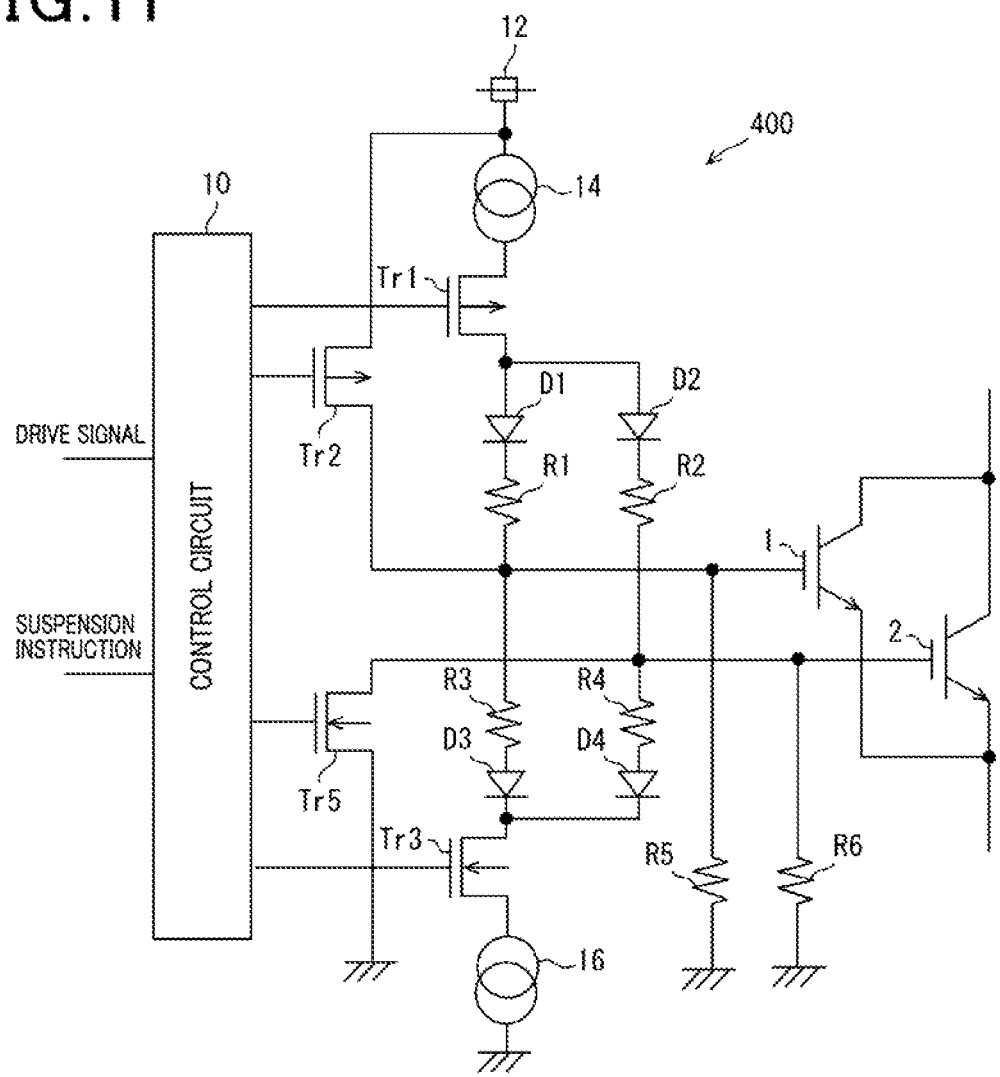
FIG. 11 is a configuration diagram illustrating a circuit configuration of an IGBT driving device according to a fourth embodiment.

Next, an IGBT driving device 400 according to a fourth embodiment of the present disclosure will be described with reference to FIGS. 11 and 12.

In the IGBT driving device 100 according to the first embodiment described above, only the off main switch Tr3 is provided as a switch for promoting discharging of the electric charge in the gates of the turned-on IGBTs to increase the speed of turning off the turned-on IGBTs. In the IGBT driving device 400 according to this embodiment, in contrast, in addition to the off main switch Tr3, an off sub-switch Tr5 is provided in parallel with the off main switch Tr3 to promote discharging of the electric charge in the gate of the second IGBT 2. Other configurations of the IGBT driving device 400 according to this embodiment are substantially the same as those of the IGBT driving device 100 according to the first embodiment and will not be described herein.

As described above with reference to the first embodiment, when the state in which the main on switch Tr1 is in the conductive state is switched to the state in which the on sub-switch Tr2 is brought into the conductive state during the IGBT-on period, the off main switch Tr3 remains in the non-conductive state. Accordingly, the electric charge stored in the gate of the second IGBT 2 is discharged via the resistor R6. If the resistance value of the resistor R6 is set to a relatively low value to increase the speed of turning off the second IGBT 2, a relatively large current flows through the resistor R6 when the second IGBT 2 is in the on state. This results in an increase in current consumption.

Accordingly, in the IGBT driving device 400 according to this embodiment, the off sub-switch Tr5 is provided for the second IGBT 2 in order to increase the speed of turning off the second IGBT 2 without increasing current consumption. As illustrated in a timing chart in FIG. 12, the off sub-switch Tr5 is switched from the non-conductive state to the conductive state when the main on switch Tr1 is switched from the conductive state to the non-conductive state and the on sub-switch Tr2 is switched from the non-conductive state to the conductive state during the on-command period of the drive signal.

Figure 12:
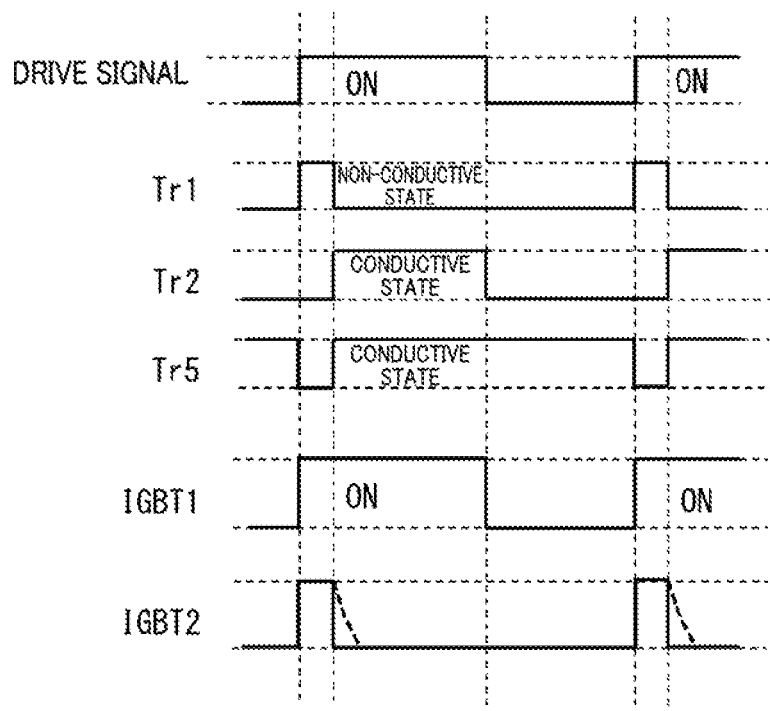
FIG. 12 is a timing chart illustrating the operation of the IGBT driving device according to the fourth embodiment.

Accordingly, for example, as indicated by a solid line in FIG. 12, the speed of reducing the gate potential of the second IGBT 2 can be higher than the speed of reducing the gate potential of the second IGBT 2 when the electric charge in the gate of the second IGBT 2 is discharged via only the resistor R6, which is indicated by a dotted line in FIG. 12. As a result, the discharging of the electric charge in the gate of the second IGBT 2 is promoted, and the second IGBT 2 can be quickly turned off.

Fifth Embodiment

Next, an IGBT driving device 500 according to a fifth embodiment of the present disclosure will be described with reference to FIG. 13.

As in the IGBT driving device 100 according to the first embodiment described above, with the use of the diodes D1 and D2 as rectifying elements to prevent the current from flowing around, when the main on switch Tr1 is in the conductive state, a voltage dropped by an amount corresponding to the forward voltage of the diodes D1 and D2 is applied to the gates of the first and second IGBTs 1 and 2. Since the forward voltage of the diodes D1 and D2 has a negative temperature characteristic, a change in ambient temperature may cause variations in the gate voltages of the IGBTs 1 and 2.

Accordingly, the IGBT driving device 500 according to this embodiment includes a power supply circuit including a temperature-dependent voltage regulator 20. The temperature-dependent voltage regulator 20 generates a power supply voltage such that changes in the power supply voltage can cancel out changes in drop voltage of the diodes D1 and D2 due to the negative temperature characteristic. With the use of the power supply circuit, a constant voltage can be applied to the gates of the IGBTs 1 and 2, irrespective of temperature changes.

Figure 13:
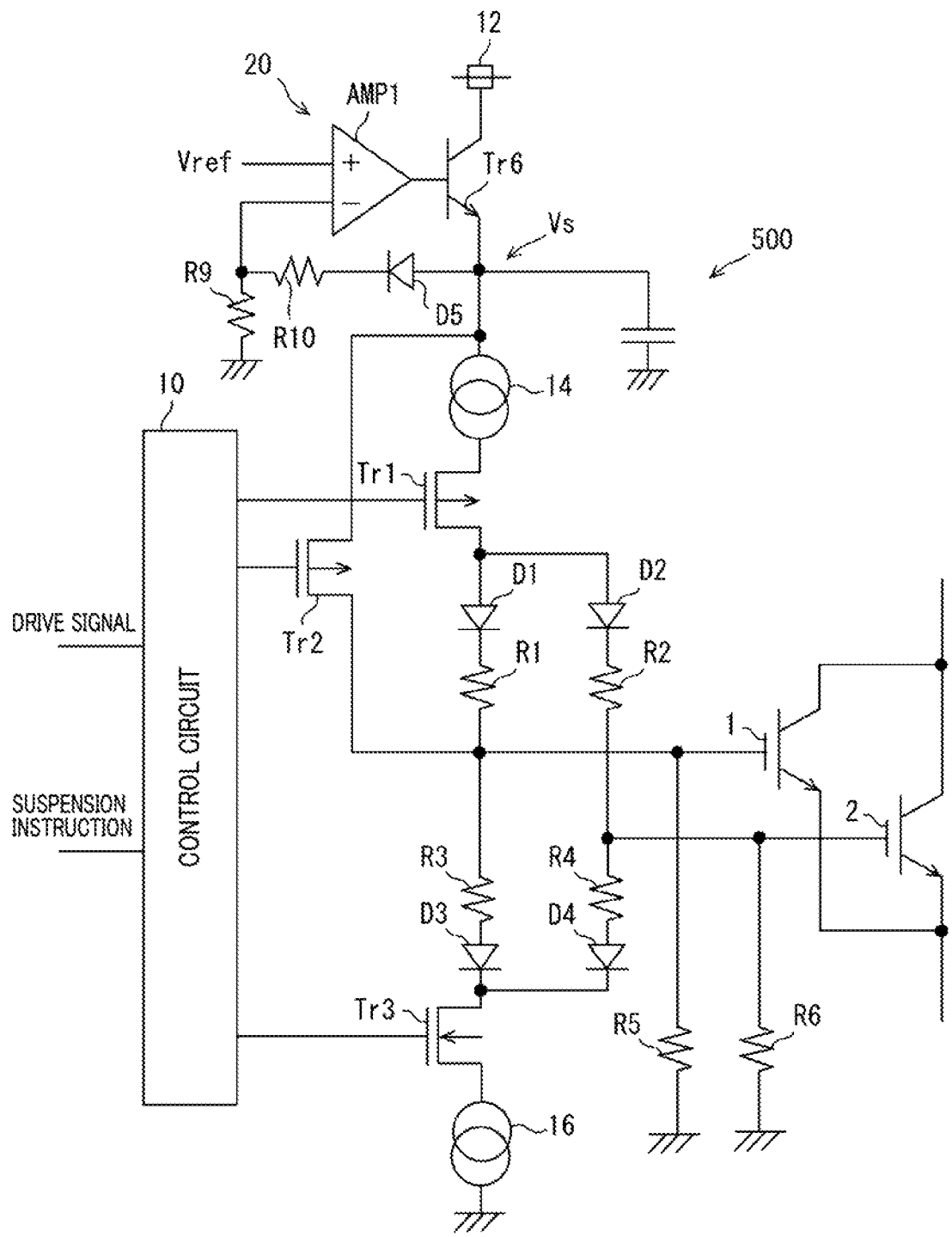
FIG. 13 is a configuration diagram illustrating a circuit configuration of an IGBT driving device according to a fifth embodiment.

In the temperature-dependent voltage regulator 20, as illustrated in FIG. 13, the feedback circuit of a differential amplifier AMP1 includes a diode D5 having a negative temperature characteristic, which is the same as the diodes D1 and D2. Accordingly, the output voltage Vs of the temperature-dependent voltage regulator 20 is equal to a voltage given by equation (3) below.

$$Vs = \{(R9+R10)/R9\} \times Vref + VF \quad (3)$$

In equation (3), Vref denotes a reference voltage, and VF denotes the forward voltage of the diode D5.

Sixth Embodiment

Next, an IGBT driving device 600 according to a sixth embodiment of the present disclosure will be described with reference to FIG. 14.

The first to fifth embodiments described above illustrate an example in which the IGBT driving devices 100 to 500 drive the two IGBTs 1 and 2, which are connected in parallel. However, an IGBT driving device may not necessarily drive two IGBTs, and may drive three or more IGBTs connected in parallel, for example.

Figure 14:
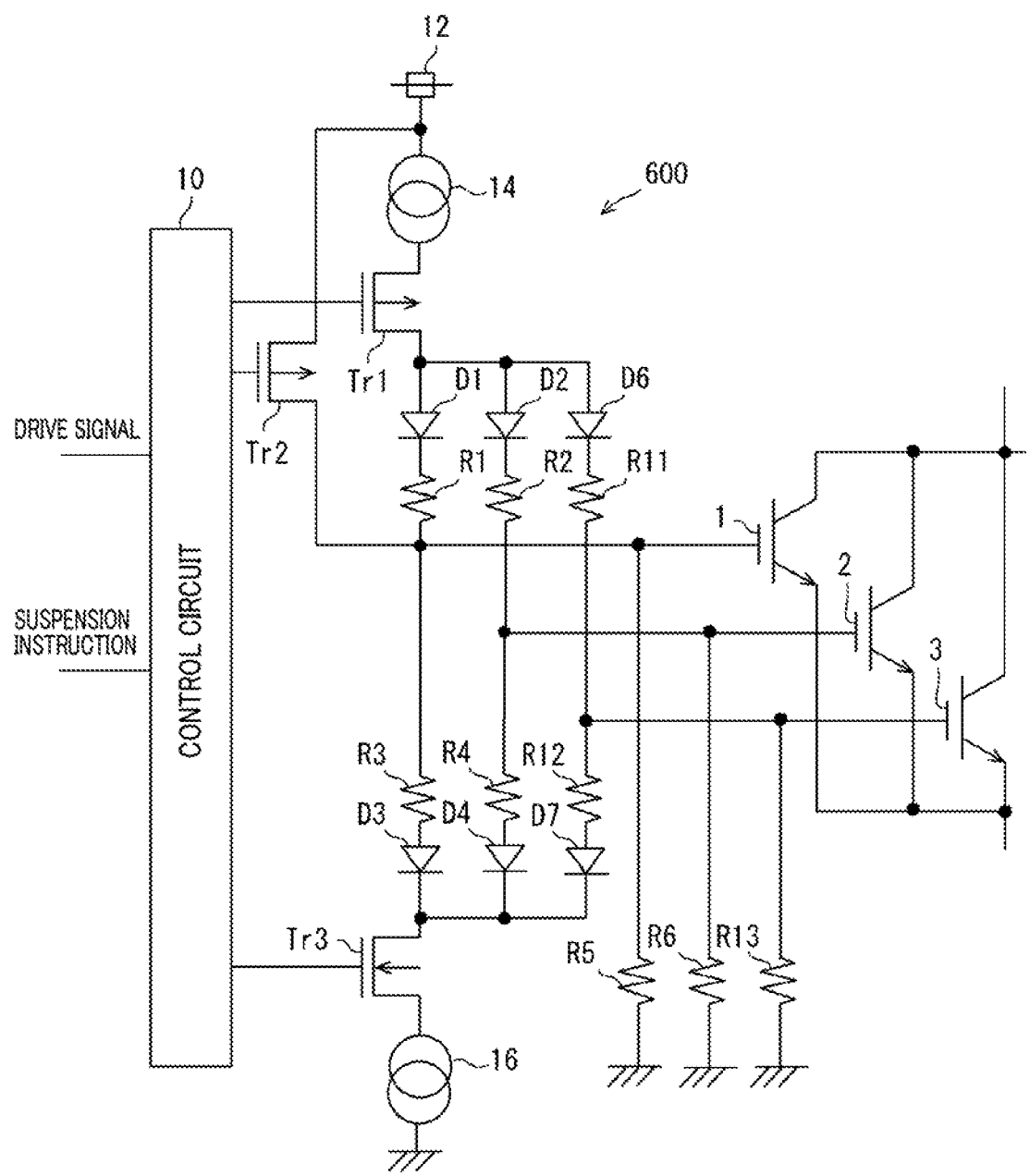
FIG. 14 is a configuration diagram illustrating a circuit configuration of an IGBT driving device according to a sixth embodiment.

FIG. 14 illustrates, for example, an example circuit configuration of the IGBT driving device 600 according to the sixth embodiment for driving three IGBTs 1, 2, and 3 connected in parallel. In the example illustrated in FIG. 14, when the main on switch Tr1 is brought into the conductive state, the first to third IGBTs 1 to 3 are turned on. In contrast, when the on sub-switch Tr2 is brought into the conductive state, only the first IGBT 1 is turned on. When the off main switch Tr3 is brought into the conductive state, a discharge current flows from the gates of the first to third IGBTs 1 to 3 via the off main switch Tr3.

However, the example circuit configuration described above is not limiting, and any other circuit configuration may be used. For example, in FIG. 14, the on sub-switch Tr2 may be connected to the gates of two IGBTs (the first IGBT 1 and the second IGBT 2, or the first IGBT 1 and the third IGBT 3) and may be configured to turn on the two IGBTs. In other words, the on sub-switch Tr2 may be configured to drive, instead of a single IGBT, a plurality of IGBTs, the number of which is smaller than the number of IGBTs to be driven by the main on switch Tr1.

In FIG. 14, furthermore, the IGBT driving device 600 may include a plurality of on sub-switches. The on sub-switches may include an on sub-switch that drives a single IGBT, and an on sub-switch that drives a plurality of IGBTs.

While preferred embodiments of the present disclosure have been described, the present disclosure is not limited to the embodiments described above. The present disclosure may be variously modified and embodied without departing from the scope of the present disclosure.

For example, while the IGBT driving devices according to the embodiments described above have been described separately, a characteristic circuit configuration in each embodiment may be embodied in combination with an IGBT driving device according to another embodiment unless they are technically inadvisable or inconsistent with one another.

In each of the embodiments described above, the first and second IGBTs 1 and 2 driven by the IGBT driving device have the same characteristics. However, the first and second IGBTs 1 and 2 may have different characteristics such as the current capacity (size) or the gate capacitance When the first and second IGBTs 1 and 2 have different gate capacitances, the resistance values of the balance resistors R1 and R2 may be set to different values such that current is more likely to flow through the gate of one of the first and second IGBTs 1 and 2 having a higher gate capacity.

The switching element drive device according to the present disclosure is described so far.

In the field of the switching element drive devices, as an example, it is disclosed a switching circuit for a first insulated-gate bipolar transistor (IGBT) and a second IGBT that are connected in parallel. In the above-mentioned conventional switching circuit, a drive circuit for the first IGBT and a drive circuit for the second IGBT are separately disposed. For example, when a current to be caused to flow through the IGBTs is larger than a threshold value, the first IGBT and the second IGBT are turned on simultaneously by the respective drive circuits. When the current is less than or equal to the threshold value, only the first IGBT is turned on by the drive circuit for the first IGBT.

However, as in the conventional configuration described above, when a separate drive circuit is disposed for each of a plurality of IGBTs connected in parallel so that the number of IGBTs to be driven can be changed, it is difficult to align the timings of actually turning on the plurality of IGBTs even if the plurality of IGBTs are to be driven simultaneously. This is because differences in the characteristics of the separate drive circuits or other reasons are likely to cause a shift in the timings of turning on the plurality of IGBTs.

The present disclosure has been made in view of the foregoing situation, and provides a switching element driving device that can change the number of switching elements to be driven and that can suppress the shift in the timings of actually turning on a plurality of switching elements when simultaneously driving the switching elements, which are connected in parallel.

To achieve the object described above, an aspect of the present disclosure provides a switching element driving device for driving a plurality of switching elements connected in parallel, the switching element driving device includes a main switch connected to gates of the plurality of switching elements, the main switch being configured to, when brought into a conductive state, increase potentials of the gates of the plurality of switching elements to turn on the plurality of switching elements; a plurality of rectifying elements each disposed between the main switch and one of the gates of the plurality of switching elements, the plurality of rectifying elements having a forward direction from the main switch to the gates of the plurality of switching elements; a sub-switch connected in parallel with the main switch, the sub-switch being connected to a gate of a switching element among the plurality of switching elements on a downstream side of the rectifying elements, the number of switching elements connected to the sub-switch being smaller than the number of switching elements connected to the main switch, the sub-switch being configured to, when brought into the conductive state, increase a potential of the gate of the switching element connected to the sub-switch to turn on the switching element connected to the sub-switch; and a control circuit that controls the conductive state and a non-conductive state of the main switch and the sub-switch.

In the switching element driving device according to the aspect of the present disclosure, when the main switch is brought into the conductive state, current flows through the gates of the plurality of switching elements via the respective rectifying elements to increase the gate potentials. In this case, if a difference occurs between the gate potentials of the plurality of switching elements, the flow of current through the gates of the plurality of switching elements is automatically adjusted to decrease the difference between the gate potentials. As a result, the shift in the timings of turning on the plurality of switching elements can be suppressed.

Further, the switching element driving device according to the aspect of the present disclosure includes a sub-switch connected in parallel with the main switch, the sub-switch being connected to a gate of a switching element among the plurality of switching elements on the downstream side of the rectifying elements, the number of switching elements connected to the sub-switch being smaller than the number of switching elements connected to the main switch. Switching between the use of the main switch and the sub-switch as appropriate can change the number of switching elements to be driven. When the sub-switch is brought into the conductive state and turns on the switching element whose gate is connected to the sub-switch, the rectifying elements prevent the current from flowing around to the gate of a turned-off switching element. This enables only the switching element whose gate is connected to the sub-switch to be driven appropriately.

The above reference numerals in parentheses are indicated to merely show an example of the correspondence with specific configurations in embodiments described below in order to facilitate understanding of the present disclosure and are not intended to limit the scope of the disclosure.

What is claimed is:

1. A switching element driving device for driving a plurality of switching elements connected in parallel, comprising:
   a main switch connected to gates of the plurality of switching elements, the main switch being configured to, when brought into a conductive state, increase potentials of the gates of the plurality of switching elements to turn on the plurality of switching elements;
   a plurality of rectifying elements each disposed between the main switch and one of the gates of the plurality of switching elements, the plurality of rectifying elements having a forward direction from the main switch to the gates of the plurality of switching elements;
   a sub-switch connected in parallel with the main switch, the sub-switch being connected to a gate of at least one of the plurality of switching elements on a downstream side of the rectifying elements, the number of switching elements connected to the sub-switch being smaller than the number of switching elements connected to the main switch, the sub-switch being configured to, when brought into the conductive state, increase a potential of the gate of the switching element connected to the sub-switch to turn on the switching element connected to the sub-switch; and
   a control circuit that controls the conductive state and a non-conductive state of the main switch and the sub-switch.

2. The switching element driving device according to claim 1, further comprising
   a plurality of resistors each connected in series with one of the rectifying elements each disposed between the main switch and one of the gates of the plurality of switching elements.

3. The switching element driving device according to claim 1,
   wherein the sub-switch is connected to a gate of a single switching element of the plurality of switching elements.

4. The switching element driving device according to claim 1,
   further comprising a plurality of the sub-switch, each disposed for one of the switching elements among the plurality of switching elements, and each the plurality of the sub-switches is connected to a gate of the corresponding one of the switching elements.

5. The switching element driving device according to claim 4,
   wherein the plurality of switching elements are periodically turned on and off in accordance with a pulse-width modulation drive signal, and
   wherein when the plurality of switching elements are to be separately turned on by using the plurality of sub-switches during an on period of the pulse-width modulation drive signal, the control circuit controls the conductive state and the non-conductive state of the plurality of sub-switches such that frequencies with which the at least two switching elements, for each of which one of the plurality of sub-switches is provided, are driven are made equal over a plurality of pulse-width modulation drive periods.

6. The switching element driving device according to claim 1,
   wherein the control circuit performs control to bring the main switch into the conductive state to turn on the plurality of switching elements, and then, when a current flowing through the plurality of switching elements is less than or equal to a predetermined value, bring the main switch into the non-conductive state and bring the sub-switch into the conductive state to keep only the switching element connected to the sub-switch in an on state.

7. The switching element driving device according to claim 1, further comprising
   a common resistor disposed in a common line that is connected to the main switch and that branches into lines each connected to one of the gates of the plurality of switching elements.

8. The switching element driving device according to claim 1, further comprising
   a constant-current source disposed in a common line that is connected to the main switch and that branches into lines each connected to one of the gates of the plurality of switching elements.

9. The switching element driving device according to claim 1, further comprising
   an off main switch connected to the gates of the plurality of switching elements on the downstream side of the rectifying elements, the off main switch being brought into the conductive state when the plurality of switching elements are switched from on to off and discharging electric charge in the gates of the turned-on switching elements to increase a speed of turning off the turned-on switching elements.

10. The switching element driving device according to claim 9, further comprising
    a plurality of off rectifying elements each disposed between the off main switch and one of the gates of the plurality of switching elements, the plurality of off rectifying elements having a forward direction from the gates of the plurality of switching elements to the off main switch.

11. The switching element driving device according to claim 10, further comprising
    a plurality of off resistors each connected in series with one of the off rectifying elements each disposed between the off main switch and one of the gates of the plurality of switching elements.

12. The switching element driving device according to claim 9, further comprising an off common resistor disposed in a common line that is connected to the off main switch and that branches into lines each connected to one of the gates of the plurality of switching elements.

13. The switching element driving device according to claim 9, further comprising
an off constant-current source disposed in a common line that is connected to the off main switch and that branches into lines each connected to one of the gates of the plurality of switching elements.

14. The switching element driving device according to claim 9,
wherein the plurality of switching elements include a switching element that is switched from on to off when the control circuit switches the main switch from the conductive state to the non-conductive state and switches the sub-switch from the non-conductive state to the conductive state, and
wherein the switching element driving device further comprises an off sub-switch connected to the gate of the switching element that is switched from on to off in response to switching of the main switch to the non-conductive state, the off sub-switch being configured to, when brought into the conductive state, discharge electric charge in the gate of the turned-on switching element to increase a speed of turning off the turned-on switching element.

15. The switching element driving device according to claim 1,
wherein the rectifying elements have a forward drop voltage having a negative temperature characteristic,
the switching element driving device further comprises a power supply circuit that generates a power supply voltage for increasing potentials of the gates of the plurality of switching elements when the main switch is brought into the conductive state, and
the power supply circuit includes a temperature-dependent voltage regulator that generates a power supply voltage such that changes in the power supply voltage cancel out changes in the drop voltage of the rectifying elements due to the negative temperature characteristic.

* * * * *